US006925408B2

United States Patent
Premy et al.

(10) Patent No.: US 6,925,408 B2
(45) Date of Patent: Aug. 2, 2005

(54) MIXED-SIGNAL CORE DESIGN FOR CONCURRENT TESTING OF MIXED-SIGNAL, ANALOG, AND DIGITAL COMPONENTS

(75) Inventors: Amit Premy, Madhya Pradesh (IN); Vudutha V. N. Suresh Gupta, Andhra Pradesh (IN); Anupama Aniruddha Agashe, Maharashtra (IN); Nikila Krishnamoorthy, Karnataka (IN); Rubin A. Parekhji, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 111 days.

(21) Appl. No.: 10/677,150

(22) Filed: Oct. 1, 2003

(65) Prior Publication Data

US 2005/0065747 A1 Mar. 24, 2005

Related U.S. Application Data
(60) Provisional application No. 60/501,071, filed on Sep. 8, 2003.

(51) Int. Cl.$^7$ .................. G01R 27/28; G01R 31/00; G01R 31/14
(52) U.S. Cl. ............................................. 702/120
(58) Field of Search ................... 702/108, 117, 702/118, 120–126, 189; 714/733, 734, 738, 740, 741, 742

(56) References Cited

U.S. PATENT DOCUMENTS

| 5,710,517 A | 1/1998 | Meyer .................. 327/163 |
| 5,748,124 A | 5/1998 | Rosenthal et al. .......... 341/120 |
| 5,905,967 A | 5/1999 | Botham .................. 702/118 |
| 6,408,412 B1 | 6/2002 | Rajsuman ................. 714/724 |
| 2002/0019962 A1 | 2/2002 | Roberts et al. ............. 714/724 |
| 2002/0194560 A1 | 12/2002 | Jain et al. ................. 714/724 |
| 2004/0158789 A1 * | 8/2004 | Chakravarthy et al. ..... 714/741 |
| 2005/0055615 A1 * | 3/2005 | Agashe et al. ............. 714/727 |

* cited by examiner

Primary Examiner—Michael Nghiem
(74) Attorney, Agent, or Firm—J. Dennis Moore; W. James Brady, III; Frederick J. Telecky, Jr.

(57) ABSTRACT

A mixed-signal core designed for efficient concurrent testing analog, mixed-signal, and digital components. One tester may test all components and, thereby, reduce test time without losing full test coverage. An analog module includes all the analog and mixed-signal components of the mixed-signal core, while a first digital module includes digital components required for functional/parametric verification of the mixed-signal components within the analog module. A first virtual boundary connects the analog and the first digital modules to gate the signal transfer during testing. A second digital module includes the remaining digital components of the mixed-signal core, whereby a second virtual boundary separates it from the first digital module. This type of partitioning enables the mixed-signal core to have three modes of operation, using which the analog, mixed-signal and digital components can all be tested.

15 Claims, 7 Drawing Sheets

MIXED-SIGNAL CORE DESIGN FOR CONCURRENT TESTING OF MIXED-SIGNAL, ANALOG, AND DIGITAL COMPONENTS

This application claims priority under 35 USC § 119(e)(1) of provisional application Ser. No. 60/501,071, filed Sep. 8, 2003.

FIELD OF THE INVENTION

The present invention relates to a method and structure for testing an embedded mixed signal core on a System-on-Chip (SoC) design, and, more particularly, to a method and apparatus for partitioning and testing the embedded mixed signal core on the SoC integrated circuit (IC).

BACKGROUND OF THE INVENTION

In the advent of increased demand for consumer electronics and continued growth in semiconductor packing density, more system functionality is integrated onto an integrated circuit. Accordingly, there is an increased need for integration of analog and mixed-mode components (i.e. analog-digital, RF-analog-digital, and mechanical-analog-digital) on the same chip as digital components. Designing such mixed-signal systems-on-chip (SoC) is distinctively challenging since it entails managing system level abstractions while simultaneously dealing with physical effects at the transistor and parasitic levels. In addition, testing next-generation SoCs entails a substantial amount of complexity due to the cost and time-to-market requirements.

An embedded core based SoC IC design conventionally includes various reusable functional blocks, such as microprocessors, interfaces, memory arrays, and digital signal processors (DSPs). These reusable functional blocks are generally referred to as cores. These cores generally include complex analog, mixed signal and digital sub-modules. For example, the SoC may include embedded cores such as an analog-to-digital (ADC) or a digital-to-analog (DAC) converter. In addition, they may include volatile and non-volatile memories.

In general, testing of embedded analog/mixed-signal cores is considered a difficult problem in SoC IC testing. While various design-for-test (DFT) schemes are used to access the embedded analog blocks, the testing is performed by specialized hardware such as mixed-signal automatic test equipment (ATE) or an IC tester. ATEs are widely used by manufacturers of semiconductor components. An ATE executes a test pattern which defines inputs to the device under test (DUT) and the expected outputs. By executing the test pattern, the ATE determines whether the component is operating properly.

Texas Instruments™ Inc.'s Asymmetric Digital Subscriber Line (ADSL) client premise equipment (CPE) modem, Sangam™ (i.e.TNETD7300), has an ADSL line driver module, power management module and a variety of digital modules including memory, processor, and host interfaces. Testing such a device is a challenge regarding coverage as well as expense; where coverage implies the amount of silicon which must be tested before it is shipped to customers. For digital modules, coverage can be quantitatively derived from the scan test coverage. For analog modules, coverage is qualitative and is based on the amount of testing (functional/parametric) performed on each analog block. For SoC devices, the coverage for analog blocks may reduce in the absence of test modes to fully access these blocks. Test cost directly stems from the amount of time to perform all testing. Using an ATE each second of test time costs approximately three cents. Thus, for sequential testing of analog and digital modules incorporated within the SoCs using an ATE, the test time and expense may be double in a worst case scenario.

The methodology for testing digital and analog blocks differs substantially. Digital blocks are tested for modeled defects largely using algorithmically generated test patterns, (e.g. automatic test pattern generator (ATPG) or memory built-in-self-test (memory BIST)). On the other hand, analog blocks are tested for functionality and characterized for specific parameters. The digital test set typically comprises of scan patterns for different fault models that are applied under burn-in and voltage box (VBox) conditions where VBox is a condition which stresses the digital logic by changing the power supply rail voltage VDD to bring out latent defects of the digital blocks. For example, if the nominal operational voltage is 1.5V, VBox limits may be 1.1V and 2.1V. In such a case, a device may be stressed using a VDD of 2.1V volts and then tested at 1.1V to bring out a defect, which depends upon the process and the statistical data. Moreover, the digital test set includes memory tests typically in the form of memory BIST. These aforementioned digital test sets differ from I/O characterization and at-speed tests. During these tests, the device is configured into scan test mode where device functionality is lost. In contrast, during analog testing (i.e. signal-to-noise ratio (SNR) and total harmonic distortion (THD)), the tests are required to be performed only when the device is in a functional operating mode. This requirement imposes the restriction that each analog and digital block be separately and sequentially tested to avoid any conflict of the scan and functional testing.

Accordingly, SoCs have been tested in the past by testing the analog and digital blocks of the chip separately and/or sequentially by enabling a power down feature for each individual block. In addition, the inputs and outputs of all blocks are multiplexed to external pins for access. The disadvantage of this approach is that a large amount of test time is required to test the entire SoC device since it is difficult to test various blocks having different test methodologies in parallel.

The present invention is directed to overcoming, or at least reducing the effects of one or more of the problems set forth above.

SUMMARY OF THE INVENTION

To address the above-discussed deficiencies of mixed-signal core design for testing, the present invention teaches a mixed-signal core designed for efficient testing capable of concurrent testing of the analog, mixed-signal, and digital components comprised within the mixed-signal core. A mixed-signal core in accordance with the present invention is enabled to use the same tester to test all components comprised within the core and, thereby, reduce test time without losing full test coverage.

The mixed-signal core includes an analog module, a first and second digital module, and a first and second virtual boundary. The analog module includes a analog components and mixed-signal components. The first digital module includes a first subset of digital components required for functional/parametric verification of the mixed-signal components within the analog module. The first virtual boundary couples between the analog module and the first digital module. The first virtual boundary having at least one multiplexer to gate signals transmitted between the analog module and the digital module. The first virtual boundary partitions the analog module from the digital module. Each multiplexer couples to receive signals generated by the analog and mixed-signal components of the analog module and the digital components of the digital module. The second digital module includes a second subset of digital components. The second virtual boundary includes at least one multiplexer to gate signals transmitted between the first and the second digital module, wherein the second virtual boundary partitions the first digital module from the second digital module. Each multiplexer of the second virtual boundary couples to receive signals generated by the first and second digital module.

The mixed signal core design in accordance with the present invention includes at least three modes of operation for testing the mixed signal core. The first mode of operation provides digital characterization testing of the first and second digital module and analog characterization/trimming testing of the analog module. To initiate this first mode of operation, the first and second virtual boundary are inactive. In a second mode of operation, concurrent testing of the analog module and the first and second digital module is conducted. Analog characterization/trimming testing is performed on the analog module and digital interface characterization testing is performed on the first digital module, while SCAN/BIST testing is performed on the second digital module. To initiate the second mode of operation, the second virtual boundary is activated to gate signals transmitted between the first and second digital module.

In a third mode of operation, non-concurrent testing of the analog module, the first digital module, and the second digital module is enabled. This third mode of operation supplies SCAN/BIST testing of the first and second subsets of digital components from the first digital module and the second digital module, while the analog module is powered down. The third of operation is initiated by the activation of both the first and second virtual boundaries to gate signals transmitted between the first digital module and the analog module and to gate signals transmitted between the first digital module and the second digital module, respectively.

Advantages of this design include but are not limited to a structure for testing a mixed-signal core on an SoC IC at a reduced test time over conventional mixed signal cores. This method and structure required for partitioning the logic design of the mixed-signal core and providing test support in accordance with the present invention helps reduce the overall test time for the SoC, while providing thorough test coverage. The mixed-signal core having partitioned modules that can be tested in parallel on the same chip, thereby reducing the overall test time.

The proposed technique not only assists in testing under normal conditions, but also during burn-in, wherein the analog module is dynamically burned using loop-back tests in the mixed-signal core for additional coverage and the digital modules is burned using scan and memory BIST patterns. This is in contrast to the traditional method where the analog module is powered down while the digital module is burned-in.

This partitioning scheme also helps in isolating and debugging the noise coupling issues between the analog and digital blocks. The test program can also be independently developed for the different partitions, and integrated later; thereby reducing the test development time.

These and other features and advantages of the present invention will be understood upon consideration of the following detailed description of the invention and the accompanying drawings.

BRIEF DESCRIPTION OF THE DRAWINGS

For a more complete understanding of the present invention and the advantages thereof, reference is now made to the following description taken in conjunction with the accompanying drawing(s) in which like reference numbers indicate like features and wherein.

DETAILED DESCRIPTION OF PREFERRED EMBODIMENTS

The present invention will now be described more fully hereinafter with reference to the accompanying drawings, in which embodiments of the invention are shown. This invention may, however, be embodied in many different forms and should not be construed as limited to the embodiments set for the herein. Rather, these embodiments are provided so that this disclosure will be thorough and complete, and will fully convey the scope of the invention to those skilled in the art.

Figure 1:
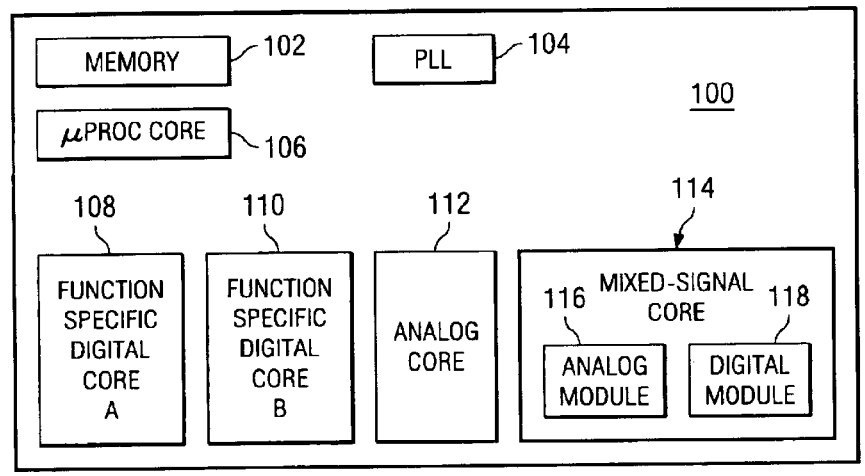
FIG. 1 is a schematic diagram showing the conventional inner structure of a large scale integrated circuit (LSI) which is commonly called a system-on-chip (SoC) IC having a several embedded core.

The present invention is best understood by comparison with the prior art. Hence, this detailed description begins with a discussion of known SoC IC similar to that shown in FIG. 1 as disclosed in U.S. Pat. No. 6,408,412 entitled "Method and Structure For Testing Embedded Analog/Mixed-Signal Cores In System-On-A-Chip". FIG. 1 is a schematic diagram showing an example of the inner structure of such an SoC 100 that includes a memory core 102, a phase lock loop (PLL) 104, microprocessor core 106, function specific digital cores 108 and 110, an analog core 112, and a mixed-signal core 114, having an analog module 116 and digital module 118.

Figure 2:
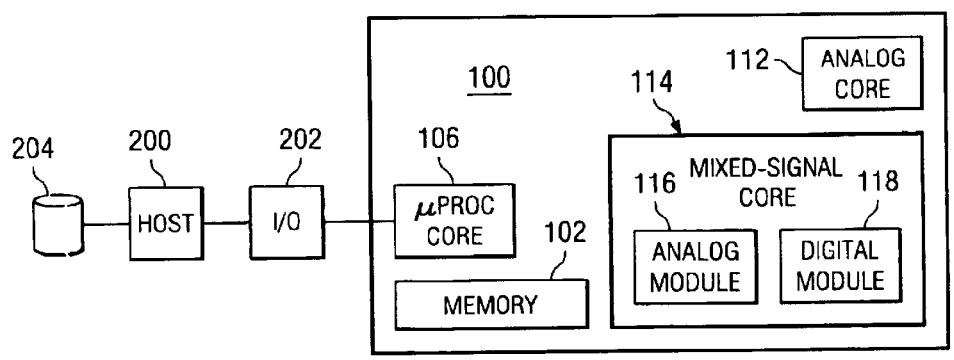
FIG. 2 is a schematic diagram showing a known overall structure for testing an analog/mixed-signal core in the SoC IC.

FIG. 2 is a schematic block diagram showing a structure for testing an analog/mixed-signal core in the SoC IC 100. In FIG. 2, the ATE includes a host computer 200, an I/O interface 202, and a hard disk 204 which are provided outside of the SoC IC 100. Typically, the hard disk 204 stores a test program to be used in testing the analog core 112 and mixed-signal core 114 in the SoC IC. The host computer 200 provides the executable code of assembly language test program to the microprocessor core 106 in the SoC chip 100 through the I/O interface 202. The assembly language test program is converted into a binary form by the assembler of the microprocessor core 106. This assembler may reside in the host computer 200 outside the SoC 100. Thus, the microprocessor core 106 generates test patterns from the object code. These test patterns are applied to the analog/mixed-signal cores 112, 114.

The present invention is directed to a method and structure for testing such embedded cores, particularly, analog and/or mixed-signal cores, such as an ADC and DAC in an SoC IC.

Figure 3:
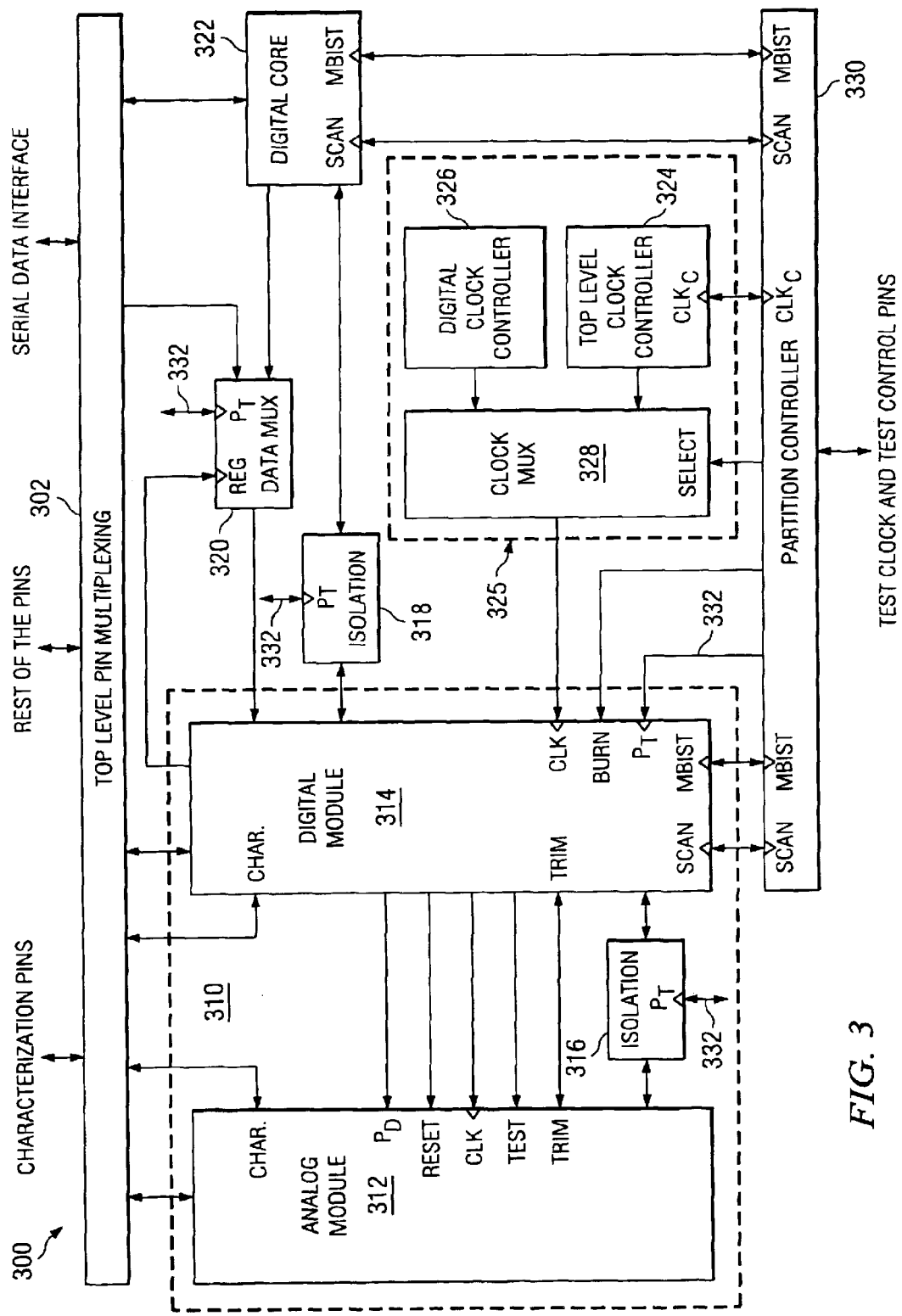
FIG. 3 shows the mixed signal core 300 designed on the SoC IC in accordance with the present invention.

FIG. 3 illustrates a mixed signal core 300 designed on an SoC IC that includes a top level pin multiplexing unit 302, a mixed signal module 310 (including an analog module 312 and a first digital module 314), a second digital module 322, a data multiplexer 320, a first isolation unit 316, a test clock generator 325 and a partition controller 330. An important criteria required for creating partitions within mixed-signal core 300 provides that the analog and mixed signal components of the mixed signal core be grouped together to form the analog module 312. In addition, a portion of the digital components, such as digital filters, that are required for the functional/parametric verification of any of the mixed-signal components, such as a sigma-delta ADC, must be grouped together to form the first digital module 314. The rest of the digital logic components and memory units within the mixed-signal core 300 are grouped together to form the second digital module 322.

Specifically, as shown, the top level pin multiplexing unit 302 provides characterization pin signals and external serial data to the mixed-signal module 310, data multiplexer 332 and the second digital module 322. The first isolation unit 316 couples between analog module 312 and the first digital module 314, while the second isolation unit 318 couples between the first digital module 314 and the second digital module 322. In addition, the second isolation unit 318 couples to receive a parallel test enable signal ($P_T$) generated by the partition controller 330. Data multiplexer 320 couples between the first digital module 314 and the second digital module 322 to provide a multiplexed data interface signal to the first digital module 314. The first digital module 314 provides a register control signal for the data multiplexer 320. The data multiplexer 320 also couples to receive the parallel test enable signal from the partition controller 330, the external serial data interface from the top level pin multiplexing unit 302, and the internal parallel data interface from the second digital module 322. Test clock generator 325 connects between the partition controller 330 and the first digital module 314 to provide a multiplexed clock. The partition controller 330 also couples to the first digital module 314 and the second digital module 322 to provide a scan signal (scan), a memory built-in self test (memory BIST) signal (MBIST), a test clock control signal ($Clk_C$), a clock select signal (Select), a burn-in control signal (Burn) for analog and digital, and the parallel test enable signal ($P_T$), as discussed previously. The scan signal include a scan-in, scan-out, and scan-enable component. The memory BIST signal includes a memory BIST status and an memory BIST control component. Within the mixed signal module 310, an analog module 312 couples to first digital module 314, wherein first digital module 314 provides a power down signal ($P_D$), a reset signal (Reset), a mixed-signal clock signal (Clk), an analog test signal (Test), and an analog trim signal (Trim) to analog module 312. Specifically, first isolation unit 316 couples between the analog module 312 and the first digital module to provide isolation of the data transferred between the two modules during concurrent testing using a characterization testing method upon the analog module 312 and a SCAN/BIST testing method on the first digital module 314. In operation, the parallel test enable signal generated by the partition controller 330 is used to control isolation unit 316. Test clock generator 325 receives the test clock control signal ($Clk_C$) an initial clocking signal from the partition controller 330. The test clock generator 325 includes a top level clock controller 324, a digital clock controller 326, and a clock multiplexer 328. The clock multiplexer 328 couples to receive the clock select signal (Select) generated by the partition controller 330.

Partitioning and isolation of the digital and analog logic permits concurrent testing of both logic sections. Additional DFT (design-for-testability) features are built in to the SoC IC such as isolation units 316 and 318, data multiplexer 320, and test clock generation 325 and using dedicated test modes for the partitions created to provide intelligent decoding and control for handling the analog/digital interface.

The individual partitioned modules, 312, 314, and 322, are separate entities that can be configured for independent/concurrent digital and analog testing. This lends support to a dual (concurrent) operating mode such that normal scan and BIST tests can be applied to the digital partition unit 322, while applying functional characterization tests to the analog and digital modules, 312 and 314.

Advantages of this design include but are not limited to a structure for testing a mixed-signal core on an SoC IC at a reduced test time over conventional mixed signal cores. This method and structure required for partitioning and test support in accordance with the present invention helps reduce the overall test time for the SoC, while providing thorough test coverage. A non-concurrent test mode is also supported. In this mode, the entire digital logic is put under test for obtaining additional coverage and ease of debug. Hence, each of the above partitions must have test mode information and relevant control signals.

Support for these modes requires incorporation of clock multiplexing, isolation at partition interfaces, additional test modes and test pin multiplexing. In addition, separate scan chain stitching and grouping is required along with memory BIST control specifically for the first digital module 314. In addition, a dual sequencer option on the ATE is required to provide independent timings for each module, 312 and 314.

Figure 4:
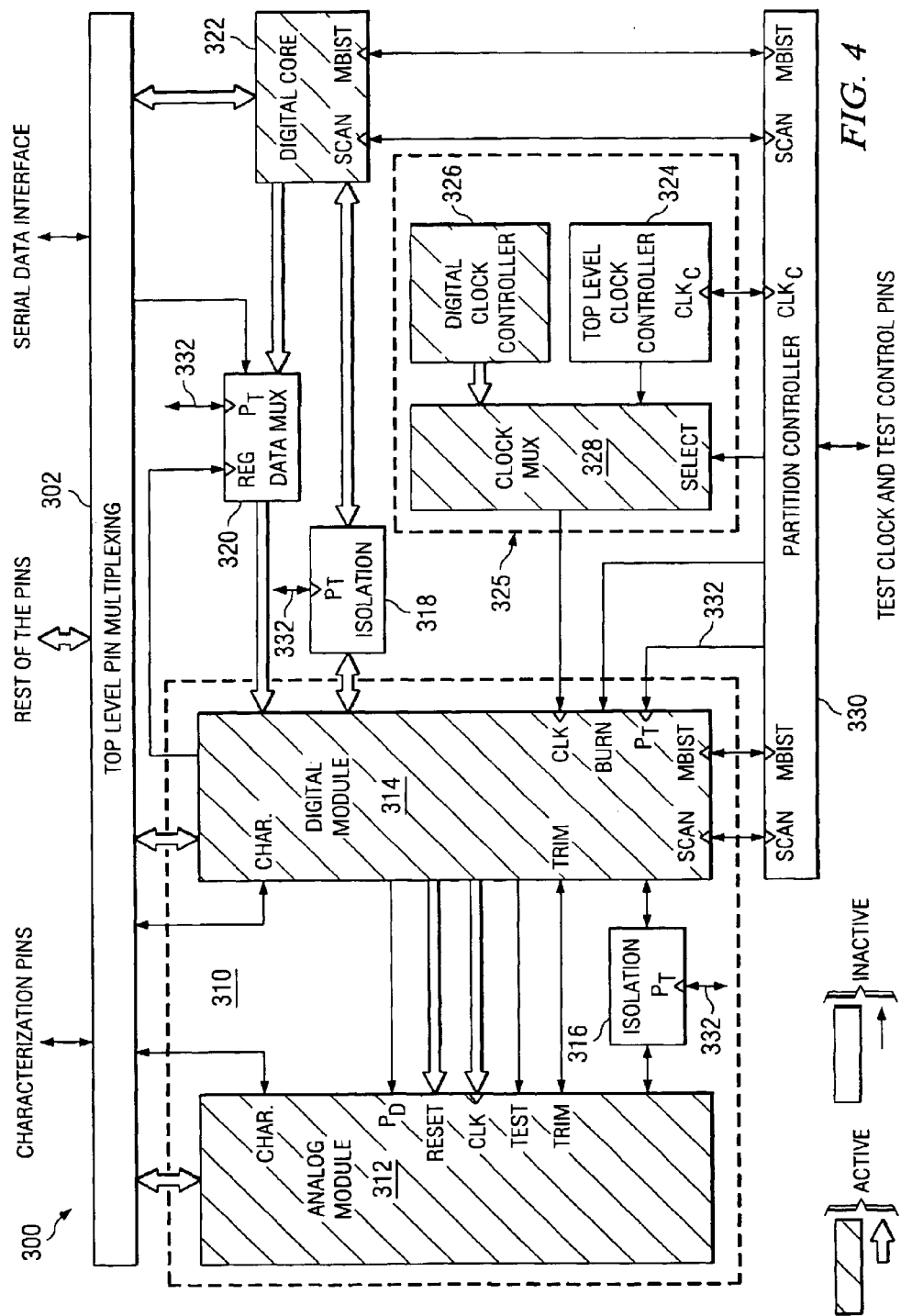
FIG. 4 displays the mixed signal core 300 designed on the SoC IC in accordance with the present invention during a functional testing mode of operation.

In a first mode of operation, the mixed-signal core 300 of SoC IC as shown in FIG. 4 includes all of the components as given in FIG. 3; however, the components and connections that are activated during this first mode of operation are shaded. The first mode of operation is the normal mode of operation where functional testing is performed upon all modules 312, 314 and 322. Accordingly, functional testing is applied to the analog module 312, the first digital module 314, the second digital module 322, digital clock controller 326, and the clock multiplexer 328. These components are active as shown. The other components, the first isolation unit 318, the second isolation unit 316, the data multiplexer 332 and the top level clock controller 324, are inactive. The data signals for operating the analog module 312 and the first digital module 314 inside the mixed signal core 310 come from the CPU within the digital core (not shown).

Figure 5:
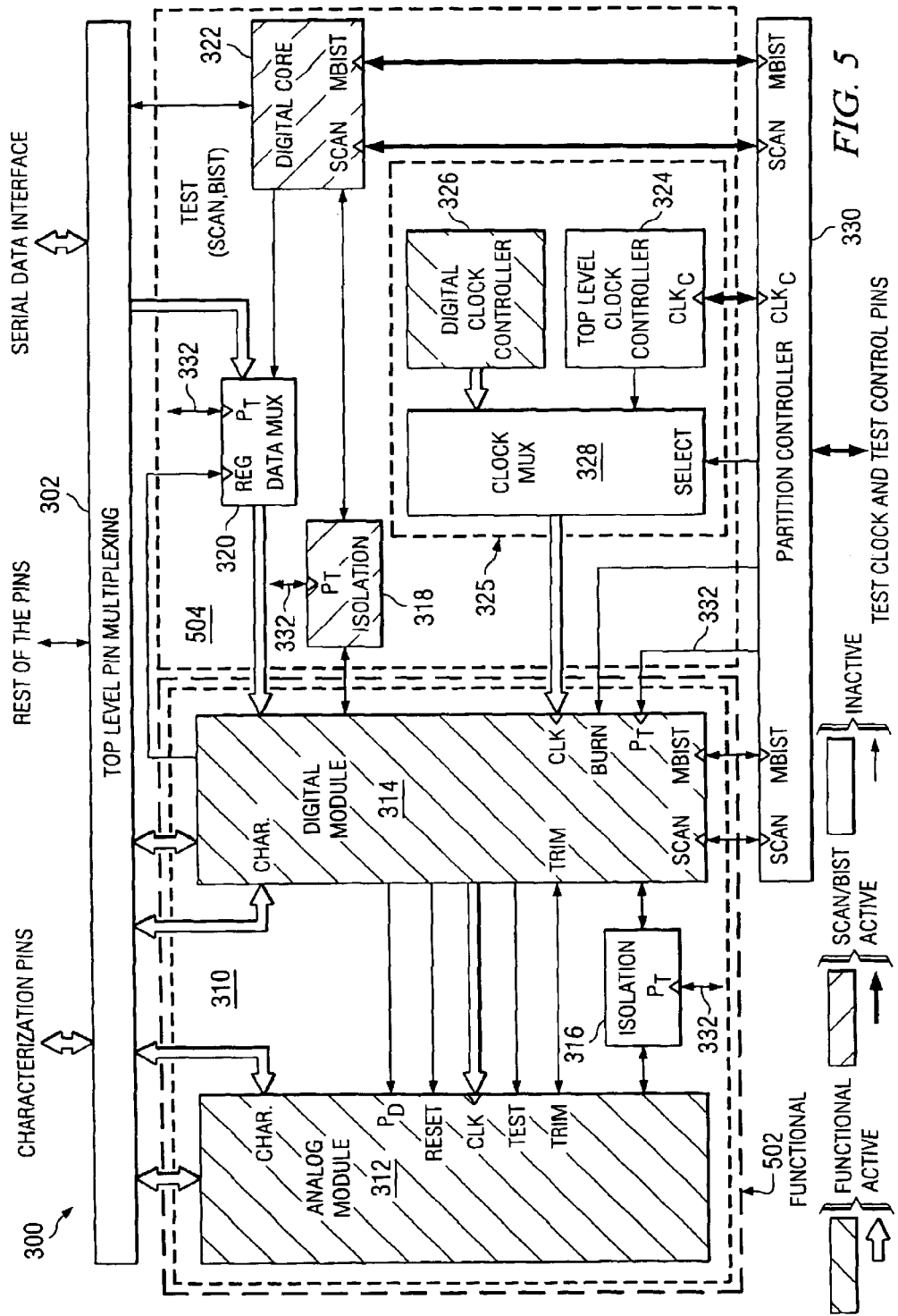
FIG. 5 illustrates the mixed signal core 300 designed on the SoC IC in accordance with the present invention during a concurrent testing mode of operation.

In a second mode of operation, the mixed-signal core 300 of SoC IC as shown in FIG. 5 includes all of the components as given in FIG. 3. Accordingly, the components and connections that are activated during this second mode of operation are shaded. Concurrent functional and SCAN/BIST testing is applied to the mixed-signal module 310 and the second digital module 322. In this second mode of operation, the second digital module 322 is under scan test and hence its registers are programmed by scanning in the data using a serial data interface input at the chip interface as shown through top level pin multiplexing unit 302 and data multiplexer 320. The SCAN/BIST testing is selected using the scan enable component of the scan signal. Concurrently, functional tests are applied to the analog module 312 and the first digital module 314, while the SCAN/BIST tests are applied to the second digital module 322. The digital clock controller 326 provides the clocking for functional testing of the analog module 312 and first digital module 314. Isolation unit 318 provides gating of signals between the first digital module 314 and the second digital module 322. Characterization testing of the analog module 312 and the first digital module 314 is conducted by transferring of signals from the top level pin multiplexing unit 302 through the characterization pins as shown. Test clock and test control pins send test clock and test control signals to partition controller 330. Partition controller 330 generates a separate scan-in and scan-out signal along with a scan enable through the scan input of the second digital module 322. Partition controller 330 generates a separate memory BIST signal and status control signal through the memory BIST input to be supplied to the second digital module 322. In addition, partition controller 330 supplies a clocking signal to the top level clock controller 324. The clock multiplexer 328 provides a multiplexed clocking signal from the inputs of the top level clock controller 324 and the digital clock controller 326 to first digital module 314 which is transferred to analog module 312.

Figure 6:
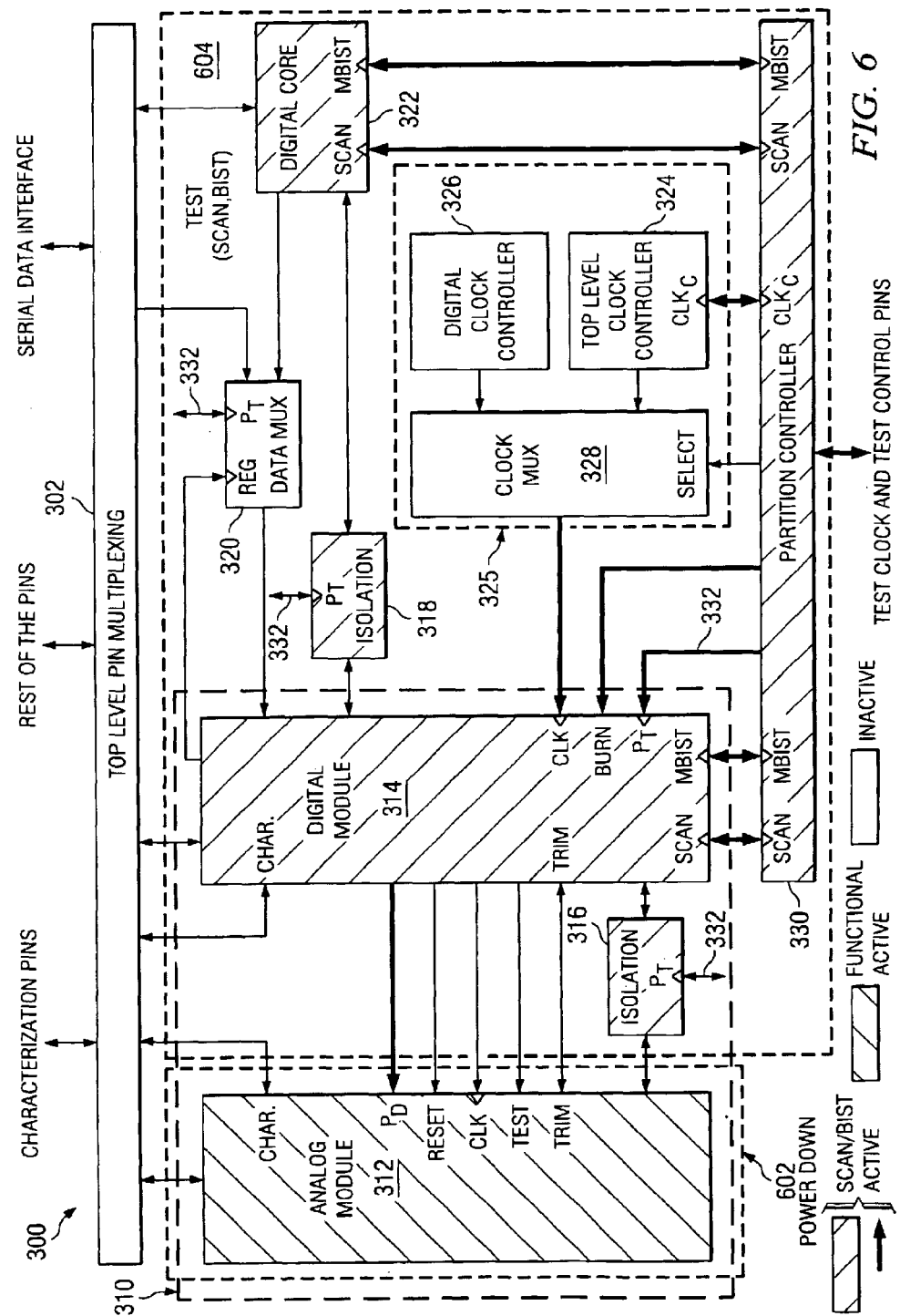
FIG. 6 shows the mixed signal core 300 designed on the SoC IC in accordance with the present invention during a non-concurrent testing mode of operation.

In the third mode of operation, the mixed-signal core 300 of SoC IC as shown in FIG. 6 includes all of the components as given in FIG. 3. Accordingly, the components and connections that are activated during this third mode of operation are shaded. SCAN/BIST testing is applied to the first digital module 314 and the second digital module 322. Specifically the analog module 312 is powered down while SCAN/BIST tests are applied to the first digital module 314 and the second digital module 322. The digital clock controller 326 multiplexed with the top level clock controller 324 provides the clocking of the SCAN/BIST testing of the first digital module 314. Isolation unit 316 provides gating of signals between the first digital module 314 and the analog module 312; while isolation unit 318 provides gating of signals between the first digital module 314 and the second digital module 322. To initiate the powering down of the analog module 312, first digital module 314 provides a power down signal to analog module 312. The test clock and test control pins send test clock and test control signals to partition controller 330. The partition controller 330 generates separate scan-in and scan-out signal along with a scan enable through the scan input to be supplied to the first and second digital module, 314 and 322. The partition controller 330 generates memory BIST status and control signals through the memory BIST input to be supplied to the first and second digital module, 314 and 322. In addition, the partition controller 330 supplies a clocking signal to the top level clock controller 324. The clock multiplexer 328 provides a multiplexed clocking signal to the first digital module 314. Partition controller 330 provides the burn-in control signal (Burn) along with the parallel testing control signal $P_T$ to first digital module 314.

Figure 7:
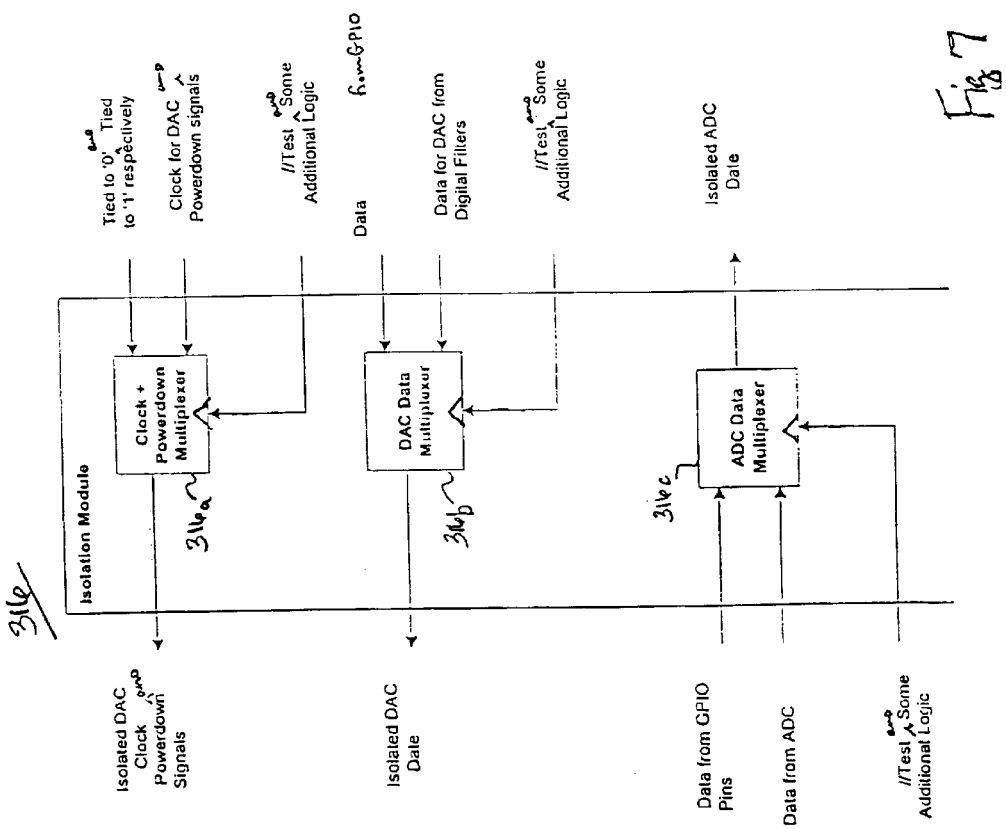
FIG. 7 displays the schematic diagram of the first isolation unit in accordance with the present invention.

In FIG. 7, the first isolation unit 316 between the analog module 312 and the first digital module 314. Isolation unit 316 provides the isolation required for signals from mixed-signal components, such as ADCs and DACs, power down signals, and clock signals. Specifically, isolation is required when the first digital module 314 is in the mode of operation where the SCAN/BIST testing is performed. Junk data from the ADC might enter DAC due to the SCAN/BIST testing. Similarly, the undetermined data may enter the DAC from ADC, which will affect the SCAN/BIST testing. As such, the first isolation unit 316 provides a buffer between these mixed-signal components to avoid the transfer of junk data. General purpose I/O (GPIO) pins provide a flexible parallel interface that allows a variety of custom connections and are used for this purpose. These GPIO pins are required for functional characterization testing of analog module 312.

Figure 8:
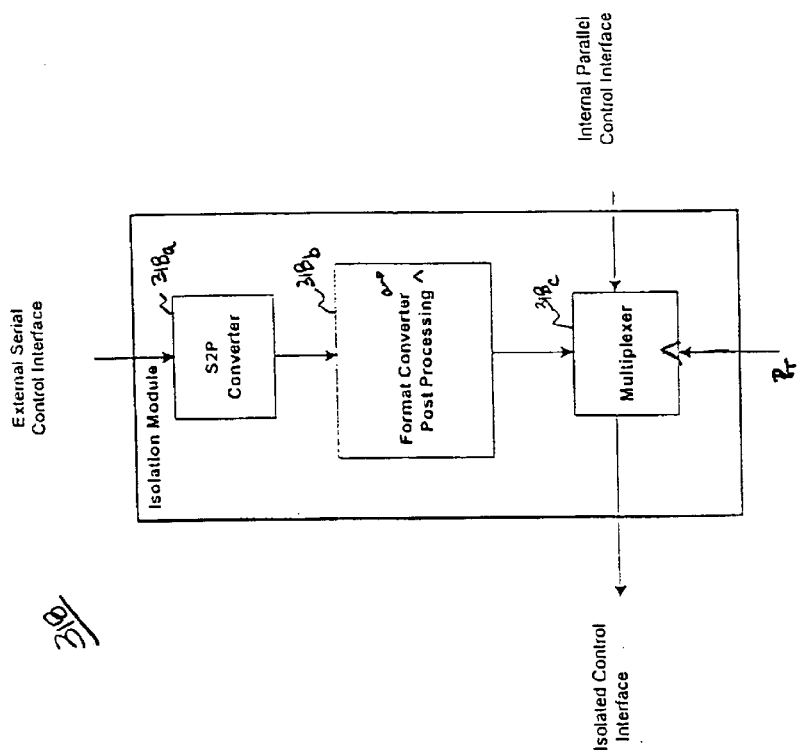
FIG. 8 illustrates the schematic diagram of the second isolation unit in accordance with the present invention.

FIG. 8 illustrates the schematic of the second isolation unit 318 connected between the first digital module 314 and the second digital module 322. In this instance, isolation is required for the control signals, such as virtual bus (VBUS) signals. All VBUS signals (i.e. read data, write data, clock ready, ready, byte enable, etc.) in accordance with the Change Back Acknowledgment (CBA) standard must be isolated. Thus, the external serial control interface couples to the second isolation unit 318 to provide these signals. A serial to parallel converter 318a couples to a format converter and post processing unit 318b. A multiplexer 318c couples to receive the processed serial interface signals along with the internal parallel control interface signals. The parallel test control signal $P_T$ provides control from multiplexer 318c. This isolation is required when BIST/SCAN testing is performed the second digital module 322 and functional testing is being performed upon the first digital module 314. Since the output from second digital module 322 may contain junk data, isolation is necessary to shield the first digital module 314.

Advantages of this design include but are not limited to a structure and testing of a mixed-signal core on an SoC IC at a reduced test time over conventional mixed signal cores. This method and structure requires that the logic design of the mixed-signal core be partitioned. In addition, test support in accordance with the present invention helps reduce the overall test time for the SoC, while providing thorough test coverage. The mixed-signal core having partitioned modules that can be tested in parallel on the same chip, thereby reducing the overall test time.

The proposed technique not only assists in testing under normal conditions, but also during burn-in, wherein the analog module 312 is dynamically burned using loop-back tests in the mixed-signal core 300 for additional coverage and the digital modules, 314 and 322, are burned using scan and memory BIST patterns. This is in contrast to the traditional method where the analog module 312 is powered down while the first digital module 314 is burned-in.

This partitioning scheme in accordance with the present invention aids in isolating and debugging the noise coupling issues between the analog and digital modules, 312 and 314. A test program may be independently developed for the different partitions, and integrated later; thereby, reducing the test development time.

Those of skill in the art will recognize that the physical location of the elements illustrated in FIG. 3 can be moved or relocated while retaining the function described above.

The reader's attention is directed to all papers and documents which are filed concurrently with this specification and which are open to public inspection with this specification, and the contents of all such papers and documents are incorporated herein by reference.

All the features disclosed in this specification (including any accompany claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

What is claimed is:

1. A mixed-signal core designed for efficient testing, comprising:

an analog module having a plurality of analog components and a plurality of mixed-signal components;

a first digital module having a first plurality of digital components required for functional/parametric verification of the plurality of mixed-signal components within the analog module;

a first virtual boundary coupled between the analog module and the first digital module, the first virtual boundary having at least one multiplexer to gate a plurality of signals transmitted between the analog module and the digital module, wherein the first virtual boundary partitions the analog module from the digital module, each of the at least one multiplexer coupled to receive the plurality of signals generated by the plurality of analog and the plurality of mixed-signal components of the analog module and the first plurality of digital components of the digital module;

a second digital module having a second plurality of digital components; and a second virtual boundary having at least one multiplexer to gate a plurality of signals transmitted between the first and the second digital module, wherein the second virtual boundary partitions the first digital module from the second digital module, each of the at least one multiplexer coupled to receive the plurality of signals generated by the first plurality of digital components and the second plurality of digital components;

wherein the structure for testing has at least three modes of operation for testing the mixed signal core, a first mode of operation that provides digital interface characterization testing of the first and second digital module and analog characterization/trimming testing of the analog module, wherein, in the first mode of operation, the first virtual boundary and the second virtual boundary are inactive;

wherein a second mode of operation that provides concurrent testing of the analog module, the first digital module, and the second digital module, wherein analog characterization/trimming testing is performed on the analog module and digital interface characterization testing is performed on the first digital module, while SCAN/BIST testing is performed on the second digital module, wherein, in the second mode of operation, the second virtual boundary is activated to gate the plurality of signals transmitted between the first digital module and the second digital module;

wherein a third mode of operation that provides non-concurrent testing of the analog module, the first digital module, and the second digital module, the third mode of operation supplies SCAN/BIST testing of the first and second plurality of digital components from the first digital module and the second digital module, while the analog module is powered down, and wherein, in the third mode of operation, the first and second virtual boundaries are activated to gate the plurality of signals transmitted between the first digital module and the analog module and to gate the plurality of signals transmitted between the first digital module and the second digital module, respectively.

2. A structure for testing an integrated circuit chip having an analog core, a mixed-signal core, a digital core, a microprocessor core, and a memory core therein, comprising:

wherein the mixed-signal core comprises:

an analog module having a plurality of analog components and a plurality of mixed-signal components, a first digital module having a first plurality of digital components required for functional/parametric verification of the plurality of mixed-signal components within the partitioned analog module, a first virtual boundary coupled between the analog module and the first digital module, the first virtual boundary having at least one multiplexer to gate a plurality of signals transmitted between the analog module and the digital module, wherein the first virtual boundary partitions the analog module from the digital module, each of the at least one multiplexer coupled to receive the plurality of signals generated by the plurality of analog and the plurality of mixed-signal components of the analog module and the first plurality of digital components of the digital module, a second digital module having a second plurality of digital components, and a second virtual boundary having at least one multiplexer to gate a plurality of signals transmitted between the first and the second digital module, wherein the second virtual boundary partitions the first digital module from the second digital module, each of the at least one multiplexer coupled to receive the plurality of signals generated by the first plurality of digital components and the second plurality of digital components;

wherein the structure for testing has at least three modes of operation for testing the mixed-signal core, a first mode of operation that provides digital interface characterization testing of the first and second digital module and analog characterization/trimming testing of the analog module, wherein, in the first mode of operation, the first virtual boundary and the second virtual boundary are inactive;

wherein a second mode of operation that provides concurrent testing of the analog module, the first digital module, and the second digital module, wherein analog characterization/trimming testing is performed on the analog module and digital interface characterization testing is performed on the first digital module, while SCAN/BIST testing is performed on the second digital module, wherein, in the second mode of operation, the second virtual boundary is activated to gate the plurality of signals transmitted between the first digital module and the second digital module;

wherein a third mode of operation that provides non-concurrent testing of the analog module, the first digital module, and the second digital module, the third mode of operation supplies SCAN/BIST testing of the first and second plurality of digital components from the first digital module and the second digital module, while the analog module is powered down, and wherein, in the third mode of operation, the first and second virtual boundaries are activated to gate the plurality of signals transmitted between the first digital module and the analog module and to gate the plurality of signals transmitted between the first digital module and the second digital module, respectively;

wherein the microprocessor core for executing microprocessor instructions multiple times and evaluating the results to ensure integrity of the microprocessor core and for testing the memory core by generating a memory test pattern by the memory core and evaluating the results; and a host computer for providing an executable test program to the microprocessor core through an interface circuit;

wherein the analog module and the first digital module are provided with a test pattern for characterization testing generated by the microprocessor core and the resultant output of the analog module and the first digital module are evaluated by either the microprocessor core or the host computer;

wherein the first and second digital module are provided with a test pattern for SCAN/BIST testing generated by the microprocessor core and the resultant output of the first and second digital module are evaluated by either the microprocessor core or the host computer.

3. A structure for testing a integrated circuit chip as recited in claim 2, wherein the test program applied to the microprocessor core is an object code of assembly language test program.

4. A structure for testing a integrated circuit chip as recited in claim 3, wherein the assembly language test program is provided to the microprocessor core from an external host computer through an I/O interface.

5. A structure for testing a integrated circuit chip as recited in claim 3, wherein the assembly language test program is provided to the microprocessor core from an external IC tester through an I/O interface.

6. A structure for testing a integrated circuit chip as recited in claim 2, wherein the integrated circuit chip is a system-on-chip (SoC) IC.

7. A mixed-signal core designed for efficient testing, comprising:

an analog module having a plurality of analog components and a plurality of mixed-signal components, a first digital module coupled to the analog module, the first digital module having a first plurality of digital components required for functional/parametric verification of the plurality of mixed-signal components within the partitioned analog module, wherein the first digital module provides a plurality of clocking signals, a power-down control signal, a reset signal, an analog test sequence to the analog module, a first isolation unit including a first plurality of multiplexers, the first isolation unit coupled between the analog module and the first digital module to form a first virtual boundary that isolates a plurality of signals between the analog module and the first digital module, a second digital module having a second plurality of digital components, a second isolation unit coupled between the first digital module and the second digital module to form a second virtual boundary that isolates a plurality of signals between the first digital module and the second digital module, a partition controller coupled to the first and second digital module to provide a test clock control signal, a SCAN enable control signal, a Built-in self test (BIST) control signal and a mixed-signal parallel test control signal, a testing clock signal generator coupled between the partition controller and the first digital module to provide a clocking signal for the first digital module, a top level pin multiplexing unit coupled to the analog module, the first digital module, and the second digital module, to multiplex serial data internal to the integrated circuit, and a data multiplexer coupled to the top level pin multiplexing unit, the first digital module and the second digital module, wherein the structure for testing has at least three modes of operation for testing the mixed-signal core, a first mode of operation that provides digital interface characterization testing of the first and second digital module and analog characterization/trimming testing of the analog module, wherein, in the first mode of operation, the first isolation unit and the second isolation unit are inactive;

wherein a second mode of operation that provides concurrent testing of the analog module, the first digital module, and the second digital module, wherein analog characterization/trimming testing is performed on the analog module and digital interface characterization testing is performed on the first digital module, while SCAN/BIST testing is performed on the second digital module, wherein, in the second mode of operation, the second isolation unit is activated to gate the plurality of signals transmitted between the first digital module and the second digital module;

wherein a third mode of operation that provides non-concurrent testing of the analog module, the first digital module, and the second digital module, the third mode of operation supplies SCAN/BIST testing of the first and second plurality of digital components from the first digital module and the second digital module, while the analog module is powered down, and wherein, in the third mode of operation, the first and second isolation units are activated to gate the plurality of signals transmitted between the first digital module and the analog module and to gate the plurality of signals transmitted between the first digital module and the second digital module, respectively.

8. A structure for testing an integrated circuit chip having an analog core, an mixed-signal core, an digital core, a microprocessor core, and a memory core therein, comprising:

wherein the mixed-signal core comprises:

an analog module having a plurality of analog components and a plurality of mixed-signal components, a first digital module coupled to the analog module, the first digital module having a first plurality of digital components required for functional/parametric verification of the plurality of mixed-signal components within the partitioned analog module, wherein the first digital module provides a plurality of clocking signals, a power-down control signal, a reset signal, an analog test sequence to the analog module, a first isolation unit including a first plurality of multiplexers, the first isolation unit coupled between the analog module and the first digital module to form a first virtual boundary that isolates a plurality of signals between the analog module and the first digital module, a second digital module having a second plurality of digital components, a second isolation unit coupled between the first digital module and the second digital module to form a second virtual boundary that isolates a plurality of signals between the first digital module and the second digital module, a partition controller coupled to the first and second digital module to provide a test clock control signal, a SCAN enable control signal, a Built-in self test (BIST) control signal and a mixed-signal parallel test control signal, a testing clock signal generator coupled between the partition controller and the first digital module to provide a clocking signal for the first digital module, a top level pin multiplexing unit coupled to the analog module, the first digital module, and the second digital module, to multiplex serial data internal to the integrated circuit, and a data multiplexer coupled to the top level pin multiplexing unit, the first digital module and the second digital module, wherein the structure for testing has at least three modes of operation for testing the mixed-signal core, a first mode of operation that provides digital interface characterization testing of the first and second digital module and analog characterization/trimming testing of the analog module, wherein, in the first mode of operation, the first isolation unit and the second isolation unit are inactive;

wherein a second mode of operation that provides concurrent testing of the analog module, the first digital module, and the second digital module, wherein analog characterization/trimming testing is performed on the analog module and digital interface characterization testing is performed on the first digital module, while SCAN/BIST testing is performed on the second digital module, wherein, in the second mode of operation, the second isolation unit is activated to gate the plurality of signals transmitted between the first digital module and the second digital module;

wherein a third mode of operation that provides non-concurrent testing of the analog module, the first digital module, and the second digital module, the third mode of operation supplies SCAN/BIST testing of the first and second plurality of digital components from the first digital module and the second digital module, while the analog module is powered down, and wherein, in the third mode of operation, the first and second isolation units are activated to gate the plurality of signals transmitted between the first digital module and the analog module and to gate the plurality of signals transmitted between the first digital module and the second digital module, respectively;

wherein the microprocessor core for executing microprocessor instructions multiple times and evaluating the results to ensure integrity of the microprocessor core and for testing the memory core by generating a memory test pattern by the memory core and evaluating the results; and a host computer for providing an executable test program to the microprocessor core through an interface circuit;

wherein the analog module and the first digital module are provided with a test pattern for characterization testing generated by the microprocessor core and the resultant output of the analog module and the first digital module are evaluated by either the microprocessor core or the host computer;

wherein the first and second digital module are provided with a test pattern for SCAN/BIST testing generated by the microprocessor core and the resultant output of the first and second digital module are evaluated by either the microprocessor core or the host computer.

9. A structure for testing a integrated circuit chip as recited in claim 8, wherein the first isolation unit comprises:

a clock/power-down multiplexer coupled between the first digital module and the analog module, the first clock/power-down multiplexer coupled to receive the clocking signal from the first digital module and a mixed-signal parallel test control signal;

a digital-to-analog converter (DAC) data multiplexer coupled between the first digital module and the analog module, the DAC data multiplexer coupled to receive the mixed-signal parallel test control signal and data from the first digital module; and an analog-to-digital converter (ADC) data multiplexer coupled between the first digital module and the analog module, the ADC data multiplexer coupled to receive the mixed-signal parallel test control signal and data from the analog module.

10. A structure for testing a integrated circuit chip as recited in claim 8, wherein the second isolation unit comprises:

a serial-to-parallel data converter coupled to receive serial data from the second digital module;

a format converter/post processing unit coupled to the serial-to-parallel converter to format and process the parallel data;

at least one multiplexer coupled to the format converter/post processing unit, the first digital module, and the second digital module to provide an isolated control interface, the at least one multiplexer coupled to receive the mixed-signal parallel test control signal from the partition controller.

11. A structure for testing a integrated circuit chip as recited in claim 8, wherein the testing clock signal generator comprises:

a digital clock controller;

a top level clock controller coupled to the partition controller; and a clock multiplexer, having a first input, a second input, a control input, and an output, to provide a multiplexed clocking signal to the first digital module, the first input coupled to the top level clock controller, the second input coupled to the digital clock controller, the control input coupled to the partition controller the output coupled to the first digital module.

12. A structure for testing a integrated circuit chip as recited in claim 8, wherein the test program applied to the microprocessor core is an object code of assembly language test program.

13. A structure for testing a integrated circuit chip as recited in claim 8, wherein the assembly language test program is provided to the microprocessor core from an external host computer through an I/O interface.

14. A structure for testing a integrated circuit chip as recited in claim 8, wherein the assembly language test program is provided to the microprocessor core from an external IC tester through an I/O interface.

15. A structure for testing a integrated circuit chip as recited in claim 8, wherein the integrated circuit chip is a system-on-chip (SoC) IC.

* * * * *